(12) United States Patent
Zhou et al.

(10) Patent No.: US 12,295,154 B1
(45) Date of Patent: May 6, 2025

(54) WIDE BANDGAP SEMICONDUCTOR STRUCTURE FOR IRRADIATION CHARACTERISTIC TEST AND PREPARATION METHOD THEREOF

(71) Applicant: NANJING UNIVERSITY, Jiangsu (CN)

(72) Inventors: Feng Zhou, Jiangsu (CN); Yu Rong, Jiangsu (CN); Hai Lu, Jiangsu (CN); Weizong Xu, Jiangsu (CN); Dong Zhou, Jiangsu (CN); Fangfang Ren, Jiangsu (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 19/004,515

(22) Filed: Dec. 30, 2024

(30) Foreign Application Priority Data

Jun. 3, 2024 (CN) .......................... 202410708841.1

(51) Int. Cl.
| | |
|---|---|
| *H10D 30/47* | (2025.01) |
| *H01L 21/66* | (2006.01) |
| *H10D 30/01* | (2025.01) |
| *H10D 62/85* | (2025.01) |
| *H10D 64/62* | (2025.01) |

(52) U.S. Cl.
CPC ......... *H10D 30/4755* (2025.01); *H01L 22/34* (2013.01); *H10D 30/015* (2025.01); *H10D 62/8503* (2025.01); *H10D 64/62* (2025.01)

(58) Field of Classification Search
CPC ..... H10D 30/4755; H10D 64/62; H01L 22/34
See application file for complete search history.

(56) References Cited

U.S. PATENT DOCUMENTS

| | | | |
|---|---|---|---|
| 2016/0380090 A1 | 12/2016 | Roberts et al. | |
| 2020/0403071 A1* | 12/2020 | Tadepalli | ................ H01L 22/20 |

FOREIGN PATENT DOCUMENTS

| | | |
|---|---|---|
| CN | 102403348 A | 4/2012 |
| CN | 115148809 A | 10/2022 |

OTHER PUBLICATIONS

1st Office Action of counterpart Chinese Patent Application No. 202410708841.1 issued on Jul. 4, 2024.
Notice of Allowance of counterpart Chinese Patent Application No. 202410708841.1 issued on Jul. 18, 2024.

* cited by examiner

*Primary Examiner* — Grant S Withers

(57) ABSTRACT

A wide bandgap semiconductor structure for an irradiation characteristic test includes a substrate with metal plates and a wide bandgap semiconductor part. The wide bandgap semiconductor part includes a gallium nitride layer, a barrier layer, P-type gallium nitride layers, source ohmic metal layers, and drain ohmic metal layers. The P-type gallium nitride layers are connected to a gate interconnection metal layer via gate metal layers and metal lead wires. A gate top metal layer is provided on the gate interconnection metal layer. Each source ohmic metal layer is provided with a source interconnection metal layer and source top metal layers. Each drain ohmic metal layer is provided with a drain interconnection metal layer and drain top metal layers. The wide bandgap semiconductor part is connected to the metal plates through the source top metal layers, the drain top metal layers, and the gate top metal layer.

7 Claims, 6 Drawing Sheets

WIDE BANDGAP SEMICONDUCTOR STRUCTURE FOR IRRADIATION CHARACTERISTIC TEST AND PREPARATION METHOD THEREOF

CROSS-REFERENCE TO RELATED APPLICATIONS

The present application claims priority benefits to Chinese Patent Application No. 202410708841.1 filed on Jun. 3, 2024, the disclosure of which is incorporated herein by reference in its entirety.

TECHNICAL FIELD

The present invention relates to the technical field of semiconductors, and in particular, to a wide bandgap semiconductor structure for an irradiation characteristic test and a preparation method thereof.

BACKGROUND

Wide bandgap semiconductor devices have the advantages of wide bandgap, high breakdown electric field, etc. In recent years, the third-generation wide bandgap semiconductors, primarily represented by gallium nitride, have attracted extensive attention from researchers. Gallium nitride devices have significant application advantages in the fields of high temperature, high frequency, high power, etc., and have been widely applied in fast charging, automobile electronics, and other fields. Specifically, gallium nitride power electronic devices with irradiation resistance can be applied in the fields such as aerospace and special military equipment. However, the devices operating in environments such as space are subject to irradiation from heavy ions, protons, neutrons, X-rays, Gamma-rays, single particles, and other rays or particles. Therefore, it is urgent to conduct research on irradiation resistance characteristics of the devices.

At present, a commercial wide bandgap semiconductor device, such as a gallium nitride high electron mobility transistor (GaN HEMT), typically includes a base layer for a substrate and an active region layer prepared on the base layer, where a top surface of the active region layer is provided with metal field plates and dielectric layers. During irradiation testing, the top surface of the GaN HEMT is generally subject to irradiation, and the irradiation characteristic test is performed based on responses from the device.

For the conventional GaN HEMT, since the top surface thereof is provided with a large number of multi-layer metal field plates and relatively thick dielectric layers, these metals and dielectric layers make it difficult for irradiation rays or particles to reach an active region of the device thereby affecting the effect of irradiation tests. In addition, in practical space applications, irradiation rays or ions come from multiple angles around the device. Therefore, it is urgent to conduct irradiation experiments with different incident angles. Since the conventional GaN HEMT has a fixed structure, the incident angle of irradiation thereof needs to be repeatedly adjusted during tests. Moreover, the conventional GaN HEMT is complex in process, and fails to ensure the effect of irradiation responses, resulting in poor effect of irradiation characteristic tests.

SUMMARY

Embodiments of the present invention provide a wide bandgap semiconductor structure for an irradiation characteristic test and a preparation method thereof, which can solve the problem in the prior art that a wide bandgap semiconductor structure has poor test effect during an irradiation characteristic test. The present invention adopts the following technical solutions:

In a first aspect, an embodiment of the present invention provides a wide bandgap semiconductor structure for an irradiation characteristic test, comprising:
  a substrate, where metal plates are disposed on the substrate at intervals; and
  a wide bandgap semiconductor part, comprising a gallium nitride layer, a barrier layer, and P-type gallium nitride layers that are arranged in a stacked manner, wherein the P-type gallium nitride layers are located above an active region gallium nitride layer and the active region gallium nitride layer is in the middle of the gallium nitride layer, a gate metal layer is disposed on each P-type gallium nitride layer, two sides of each P-type gallium nitride layer are provided with a source ohmic metal layer and a drain ohmic metal layer respectively, the source ohmic metal layer and the drain ohmic metal layer have different distances from one P-type gallium nitride layer which locates between the source ohmic metal layer and the drain ohmic metal layer, the source ohmic metal layer and the drain ohmic metal layer are connected to the active region gallium nitride layer, a gate pad is disposed on one side of the active region gallium nitride layer, the gate pad is connected to the gate metal layer through a metal lead wire, a gate interconnection metal layer and a gate top metal layer are sequentially disposed on the gate pad, a source interconnection metal layer and source top metal layers are sequentially disposed on the source ohmic metal layer, a drain interconnection metal layer and drain top metal layers are sequentially disposed on the drain ohmic metal layer, an isolating dielectric layer is deposited in gaps among the source top metal layers, the drain top metal layers, the gate top metal layer, and the gallium nitride layer, the wide bandgap semiconductor part is disposed above the substrate and is connected to the metal plates through the source top metal layers and the drain top metal layers, enabling the gallium nitride layer to be located at the top of the wide bandgap semiconductor structure for an irradiation characteristic test.

Optionally, the P-type gallium nitride layers are strip-shaped, the source top metal layers and the drain top metal layers are disposed at intervals along a length direction of each P-type gallium nitride layer, and the source top metal layers have different thicknesses from that of the drain top metal layers.

Optionally, a plurality of source top metal layers are disposed on the source interconnection metal layer, a plurality of drain top metal layers are disposed on the drain interconnection metal layer, and the plurality of source top metal layers and the plurality of drain top metal layers are alternately disposed at intervals along the length direction of each P-type gallium nitride layer and have gradually increasing thicknesses.

Optionally, the gate pad is located on one side of the source top metal layer or the drain top metal layer with a minimum thickness, and the gate top metal layer has a thickness less than that of the source top metal layer or the drain top metal layer with the minimum thickness.

Optionally, a first etching via is formed in the isolating dielectric layer between each source top metal layer and the source interconnection metal layer, each source top metal layer is connected to the source interconnection metal layer through metal deposited in the first etching via; and a second etching via is formed in the isolating dielectric layer between each drain top metal layer and the drain interconnection metal layer, each drain top metal layer is connected to the drain interconnection metal layer through metal deposited in the second etching via.

Optionally, a plurality of P-type gallium nitride layers are disposed in parallel on the barrier layer at intervals, the same source ohmic metal layer or the same drain ohmic metal layer is commonly used between two adjacent P-type gallium nitride layers, and in a width direction of each P-type gallium nitride layer, the length of each source top metal layer is greater than or equal to a maximum spacing between inner surfaces of two first etching vias that are located in a width direction of the same P-type gallium nitride layer and are furthest apart from each other, and the length of each drain top metal layer is greater than or equal to a maximum spacing between inner surfaces of two second etching vias that are located in the width direction of the same P-type gallium nitride layer and are furthest apart from each other.

Optionally, the source top metal layers, the drain top metal layers, and the gate top metal layer are soldered to the metal plates through a filling solder.

Optionally, a plurality of metal plates are disposed on the substrate at intervals and are in one-to-one correspondence with the gate top metal layer, the source top metal layers, and the drain top metal layers, and the metal plates are rectangular and have a length ranging from 1 cm to 3 cm, a width ranging from 1 cm to 3 cm, and a thickness ranging from 0.1 cm to 0.7 cm.

In a second aspect, an embodiment of the present invention provides a preparation method for preparing the wide bandgap semiconductor structure for an irradiation characteristic test described in the first aspect mentioned above. The preparation method includes:

S1, sequentially growing the substrate layer, the gallium nitride layer, and the barrier layer, growing and etching the P-type gallium nitride layers on the barrier layer, etching the gallium nitride layer and the barrier layer, and removing the barrier layer around an active region and a partial thickness of the gallium nitride layer around the active region to obtain the active region gallium nitride layer;

S2, depositing an isolating dielectric layer on the gallium nitride layer, and etching and depositing the source ohmic metal layer and the drain ohmic metal layer;

S3, depositing an isolating dielectric layer again, and etching and depositing the gate metal layer, the gate pad, and the metal lead wire;

S4, depositing an isolating dielectric layer again, and etching and depositing the source interconnection metal layer, the drain interconnection metal layer, and the gate interconnection metal layer on the source ohmic metal layer, the drain ohmic metal layer, and the gate pad, respectively;

S5, depositing an isolating dielectric layer again, and etching and depositing the source top metal layers, the drain top metal layers, and the gate top metal layer on the source interconnection metal layer, the drain interconnection metal layer, and the gate interconnection metal layer, respectively; and S6, flipping the structure prepared through the above steps onto the substrate, connecting the source top metal layers, the drain top metal layers, and the gate top metal layer to the metal plates on the substrate, and stripping the substrate layer to form the wide bandgap semiconductor structure.

Optionally, the step of S5 includes:

depositing the isolating dielectric layer in one piece, etching the isolating dielectric layers above the source interconnection metal layer, the drain interconnection metal layer, and the gate interconnection metal layer, and depositing a source top metal layer, a drain top metal layer, and a gate top metal layer with a thickness of $h_0$, respectively; and depositing again a source top metal layer and a drain top metal layer with a thickness of $h_1-h_0$ above the source top metal layers and the drain top metal layers, and repeating such operation until the source top metal layer or the drain top metal layer with a thickness of $h_n$ (n being greater than or equal to 2) is formed, so as to form a plurality of source top metal layers and a plurality of drain top metal layers that are sequentially and alternately arranged and have different thicknesses.

Optionally, the source top metal layer and the drain top metal layer with different thicknesses are prepared using a photolithographic stripping method.

The technical solutions provided by the embodiments of the present invention have at least the following beneficial effects:

Compared to the conventional GaN HEMT, according to the wide bandgap semiconductor structure for an irradiation characteristic test provided by the embodiments of the present invention, the wide bandgap semiconductor part is flipped on the substrate by metal bonding, and a substrate layer at the bottom of the conventional transistor structure is stripped off using a laser stripping method during preparation, so that the gallium nitride layer is located at the top layer of the entire wide bandgap semiconductor structure. At this time, irradiation is performed by means of incidence from the bottom, so that the irradiation rays or particles can easily reach the active region of the device, thereby ensuring the effect of irradiation tests and solving the problem in the prior art that the wide bandgap semiconductor structure has poor effect of irradiation characteristic tests.

At the same time, the thickness of the top layer of each top metal layer is differentiated during deposition of the wide bandgap semiconductor part, so that the gallium nitride layer located at the top is arranged at a certain included angle to the substrate after the wide bandgap semiconductor part is flipped on the substrate. Without adjusting an incident angle of an irradiation light source, the included angle can be finely adjusted by adjusting the angle of the substrate or by adjusting the deposition thicknesses of the source top metal layers and the drain top metal layers during preparation, and thus the irradiation tests can be performed conveniently and quickly at different angles, and the test efficiency can be effectively improved.

Further, by implementing multi-point connections between the gate top metal layer, the plurality of source top metal layers, and the plurality of drain top metal layers and the metal plates on the substrate, the contact area between the wide bandgap semiconductor part and the substrate is increased, so that a large amount of heat generated by carrier aggregation during irradiation can be effectively dissipated, thereby facilitating the reinforcement design of the wide bandgap semiconductor device subjected to irradiation.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and those of ordinary skill in the art may still derive other accompanying drawings from these accompanying drawings without creative efforts.

In the figures: 1-substrate; 2-wide bandgap semiconductor part; 11-metal plate; 21-active region gallium nitride layer; 22-barrier layer; 23-P-type gallium nitride layer; 24-source ohmic metal layer; 25-drain ohmic metal layer; 26-isolating dielectric layer; 27-gate pad; 231-gate metal layer; 241-source interconnection metal layer; 242-source top metal layer; 251-drain interconnection metal layer; 252-drain top metal layer; 261-first etching via; 262-second etching via; 271-metal lead wire; 272-gate interconnection metal layer; 273-gate top metal layer; a-substrate layer; b-gallium nitride layer.

DETAILED DESCRIPTION OF EMBODIMENTS

To make the objectives, technical solutions, and advantages of the present invention clearer, the following further describes the embodiments of the present invention in detail with reference to the accompanying drawings.

For the GaN HEMT in the prior art, 1 to 4 layers of field plates are located on the top surface of the transistor, and relatively thick dielectric layers are located above the field plates, therefore, the top surface of the transistor is about 6 µm to 20 µm thick from the barrier layer. During execution of experimental study, when an irradiation depth is less than 20 µm, it is highly likely that the rays/particles cannot irradiate the inside of the transistor, and the transistor has almost no response to the rays/particles, which affects the progress of experiments.

Figure 1:
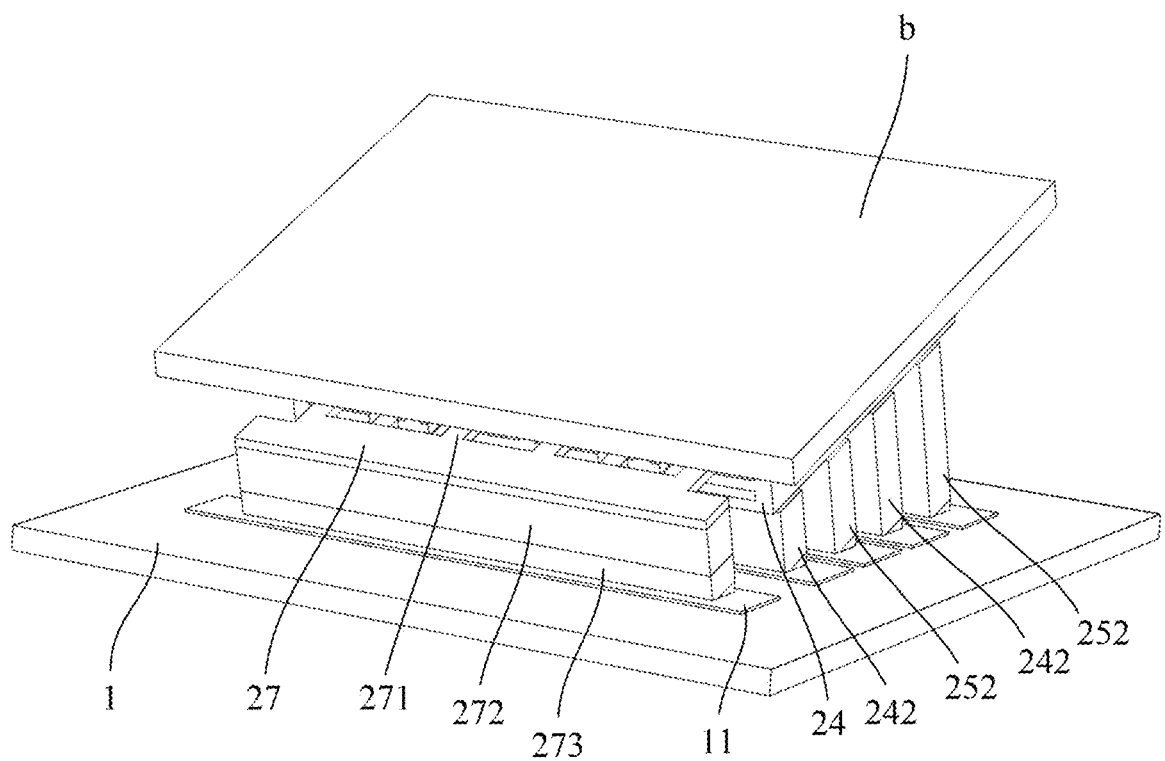
FIG. 1 is a three-dimensional schematic structural diagram of a wide bandgap semiconductor structure for an irradiation characteristic test at an angle provided by an embodiment of the present invention.
Figure 2:
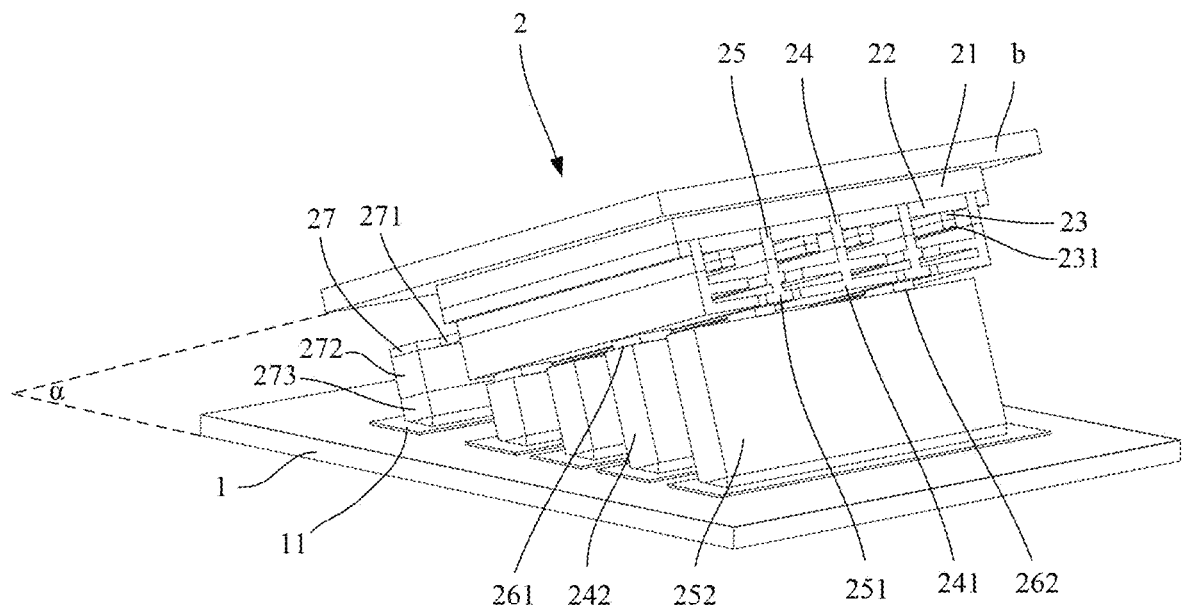
FIG. 2 is a three-dimensional schematic structural diagram of a wide bandgap semiconductor structure for an irradiation characteristic test at another angle provided by an embodiment of the present invention.
Figure 3:
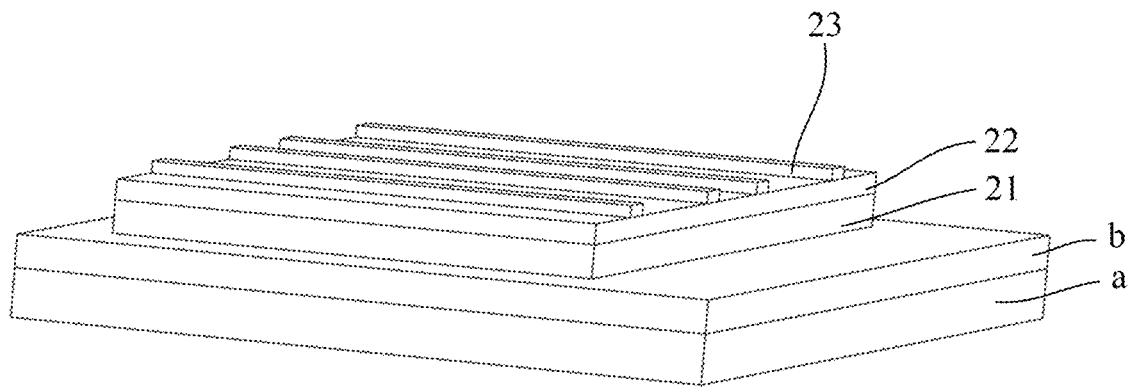
FIG. 3 is a schematic diagram of a structure grown and etched with a substrate layer, a gallium nitride layer, a barrier layer, P-type gallium nitride layers, and an active region gallium nitride layer according to an embodiment of the present invention.
Figure 4:
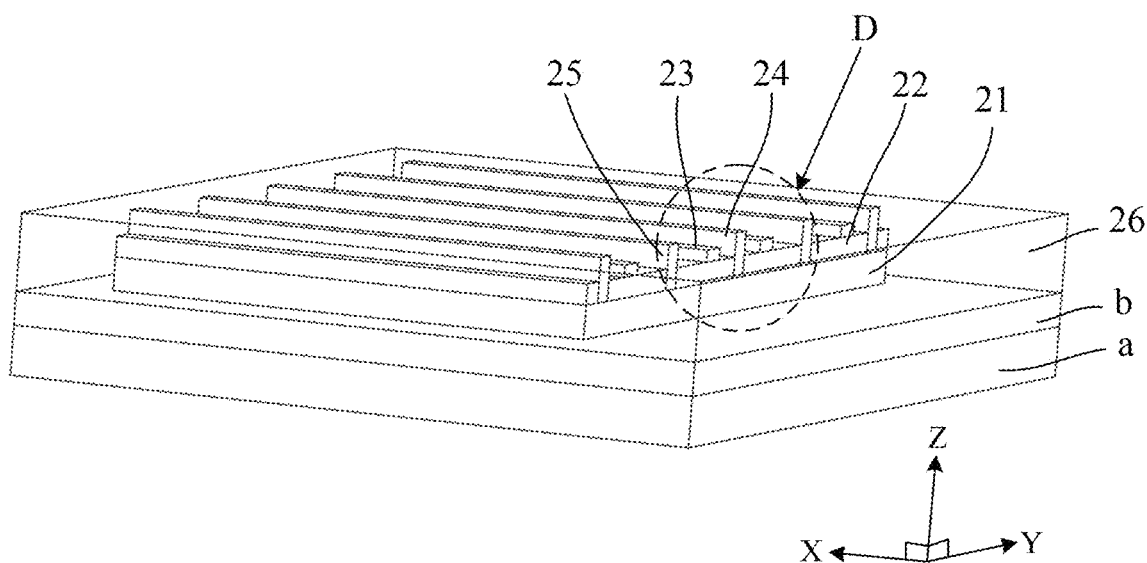
FIG. 4 is a schematic diagram of a structure formed after depositing isolating dielectric layers as well as etching and depositing a source ohmic metal layer and a drain ohmic metal layer on the structure shown in FIG. 3 according to an embodiment of the present invention.
Figure 5:
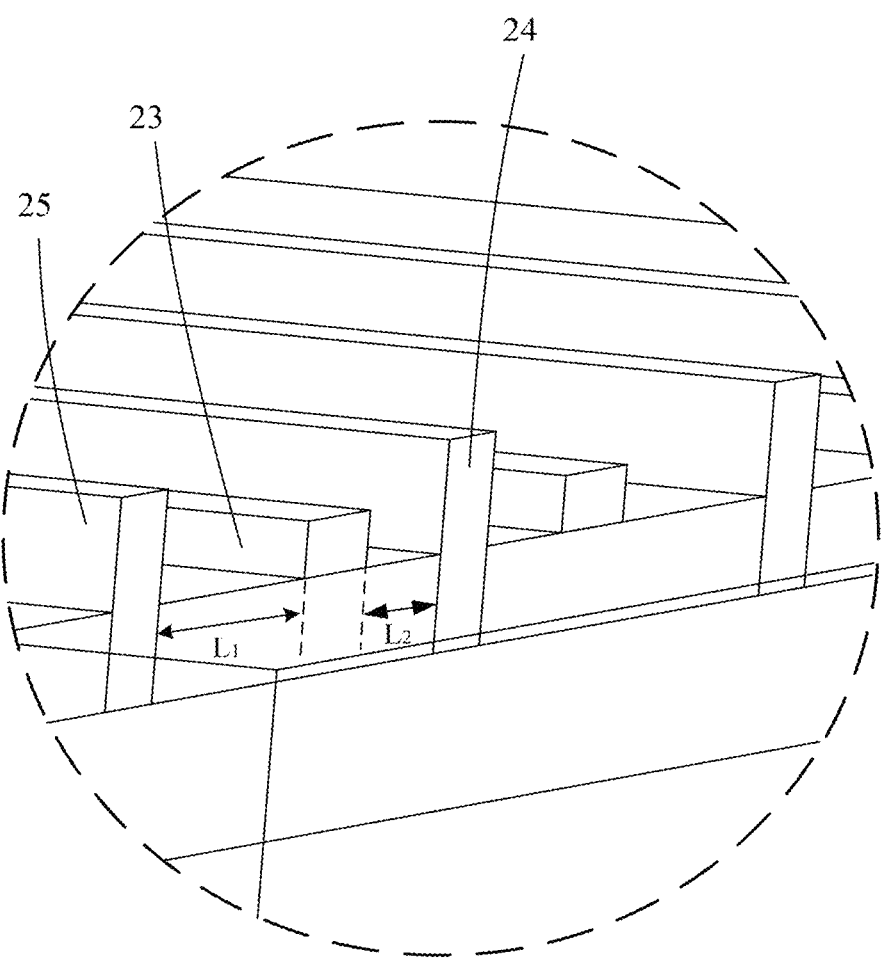
FIG. 5 is an enlarged schematic diagram of part D shown in FIG. 4.
Figure 6:
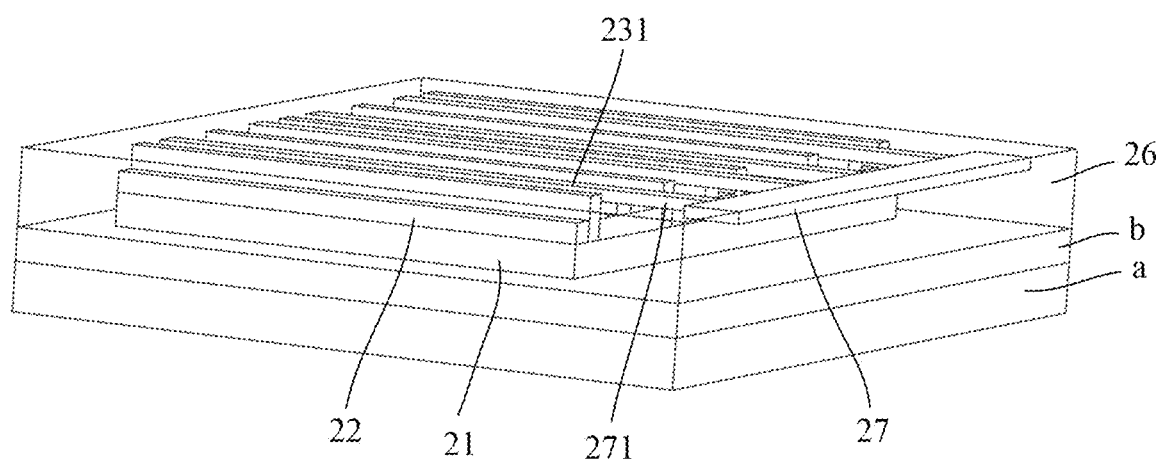
FIG. 6 is a schematic diagram of a structure formed after depositing isolating dielectric layers as well as etching and depositing a gate metal layer and a gate pad on the structure shown in FIG. 4 according to an embodiment of the present invention.
Figure 7:
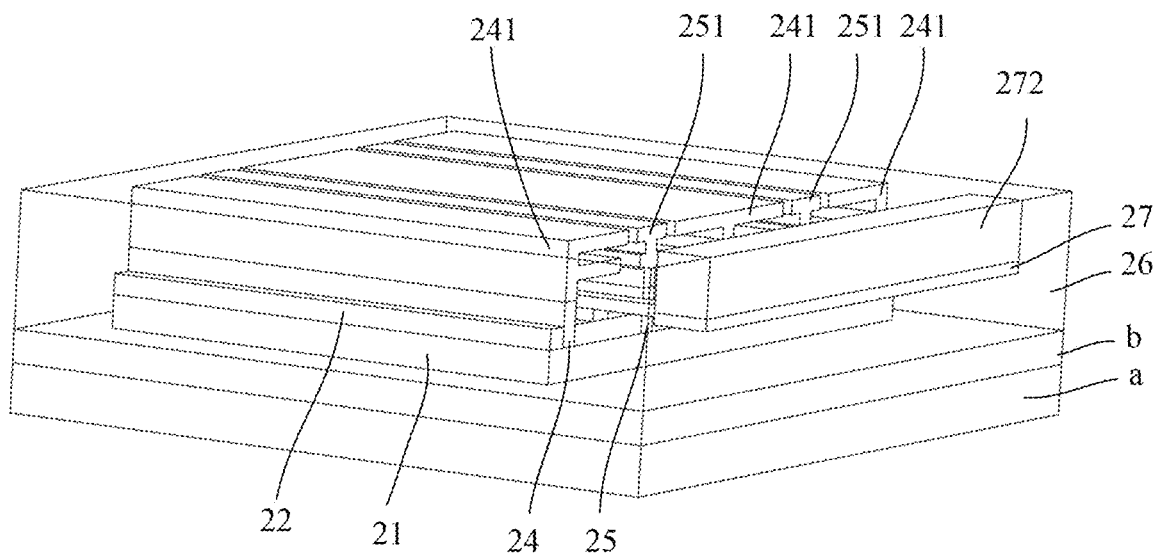
FIG. 7 is a schematic diagram of a structure formed after depositing isolating dielectric layers as well as etching and depositing a source interconnection metal layer, a drain interconnection metal layer, and a gate interconnection metal layer on the structure shown in FIG. 6 according to an embodiment of the present invention.
Figure 8:
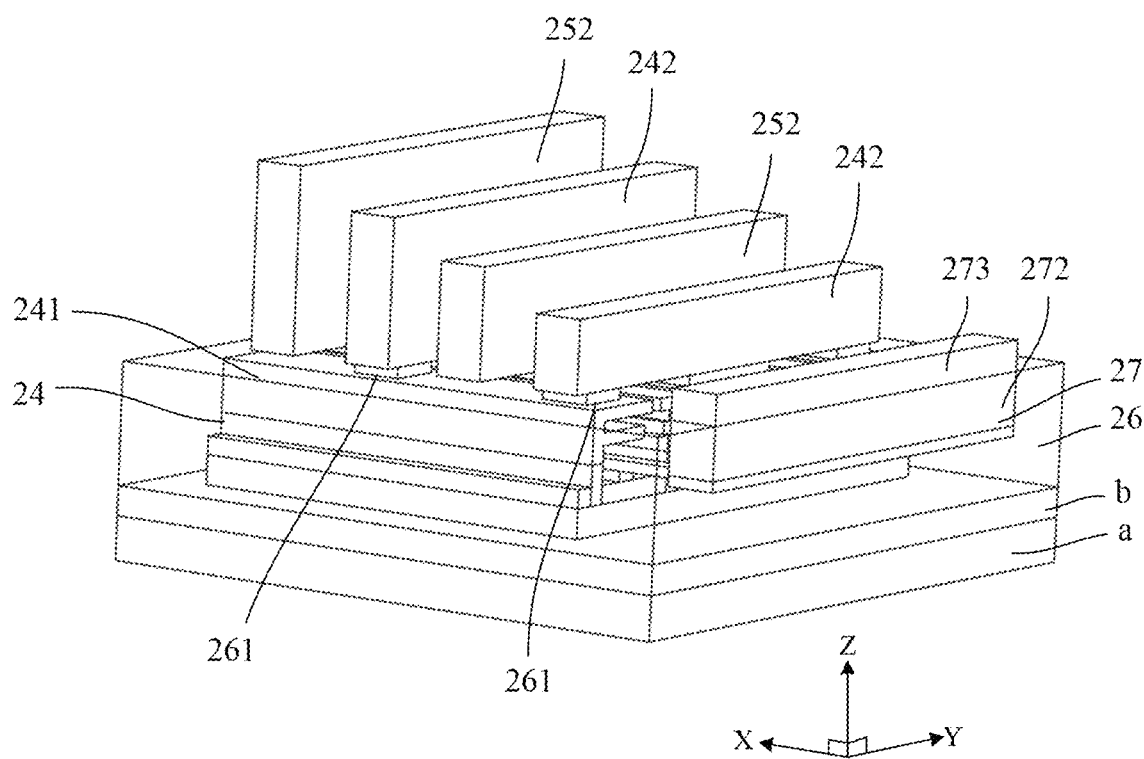
FIG. 8 is a schematic diagram of a structure formed after growing source top metal layers, drain top metal layers, and a gate top metal layer on the structure shown in FIG. 7 according to an embodiment of the present invention.
Figure 9:
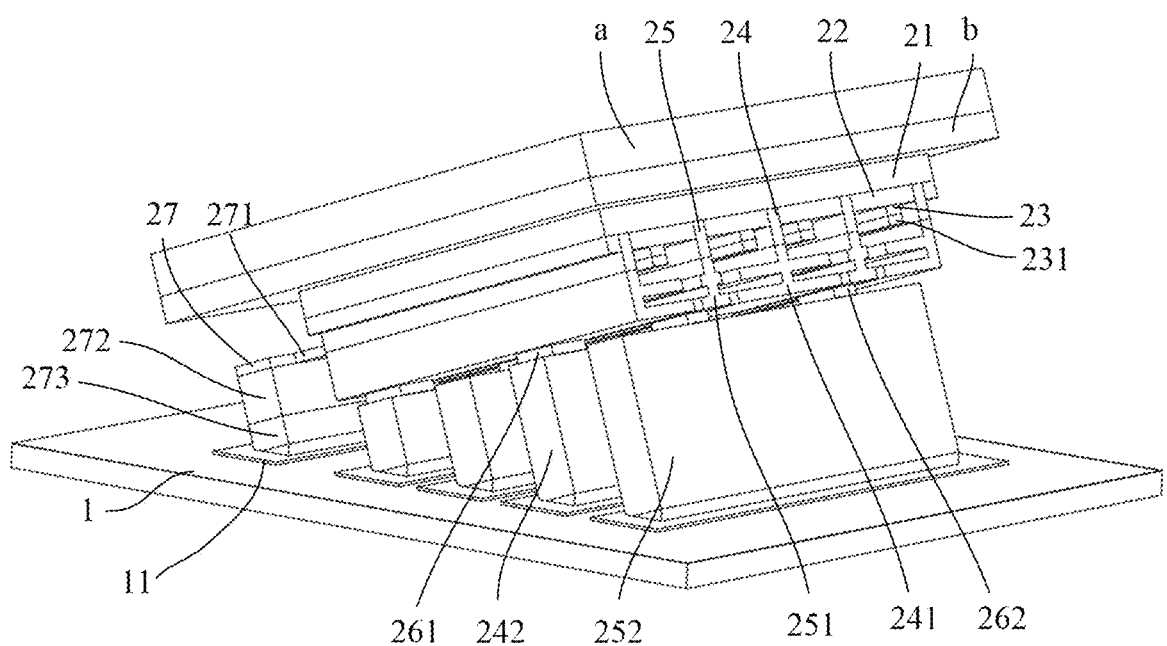
FIG. 9 is a schematic structural diagram of a wide bandgap semiconductor structure with a substrate layer obtained by performing flip-chip bonding on the structure shown in FIG. 8 according to an embodiment of the present invention.

FIG. 1 is a three-dimensional schematic structural diagram of a wide bandgap semiconductor structure for an irradiation characteristic test at an angle provided by an embodiment of the present invention; FIG. 2 is a three-dimensional schematic structural diagram of a wide bandgap semiconductor structure for an irradiation characteristic test at another angle provided by an embodiment of the present invention; FIG. 3 is a schematic diagram of a structure grown and etched with a substrate layer, a gallium nitride layer, a barrier layer, P-type gallium nitride layers, and an active region gallium nitride layer according to an embodiment of the present invention; FIG. 4 is a schematic diagram of a structure formed after depositing isolating dielectric layers as well as etching and depositing a source ohmic metal layer and a drain ohmic metal layer on the structure shown in FIG. 3 according to an embodiment of the present invention; FIG. 5 is an enlarged schematic diagram of part D shown in FIG. 4; FIG. 6 is a schematic diagram of a structure formed after depositing isolating dielectric layers as well as etching and depositing a gate metal layer and a gate pad on the structure shown in FIG. 4 according to an embodiment of the present invention; FIG. 7 is a schematic diagram of a structure formed after depositing isolating dielectric layers as well as etching and depositing a source interconnection metal layer, a drain interconnection metal layer, and a gate interconnection metal layer on the structure shown in FIG. 6 according to an embodiment of the present invention; FIG. 8 is a schematic diagram of a structure formed after growing source top metal layers, drain top metal layers, and a gate top metal layer on the structure shown in FIG. 7 according to an embodiment of the present invention; and FIG. 9 is a schematic structural diagram of a wide bandgap semiconductor structure with a substrate layer obtained by performing flip-chip bonding on the structure shown in FIG. 8 according to an embodiment of the present invention.

As shown in FIG. 1 to FIG. 9, the embodiments of the present invention provide a wide bandgap semiconductor structure for an irradiation characteristic test, including a substrate 1 and a wide bandgap semiconductor part 2. A plurality of metal plates 11 are disposed on the substrate 1 at intervals.

The wide bandgap semiconductor part 2 includes a gallium nitride layer b, a barrier layer 22, and P-type gallium nitride layers 23 that are sequentially arranged in a stacked manner. An active region gallium nitride layer 21 is formed in a middle part of the gallium nitride layer b. The barrier layer 22 is sandwiched between the active region gallium nitride layer 21 and the P-type gallium nitride layers 23. The P-type gallium nitride layers 23 are located on the barrier layer 22 and above an active region gallium nitride layer 21. A source ohmic metal layer 24 and a drain ohmic metal layer 25 are provided on two sides of each P-type gallium nitride layer 23 respectively. The source ohmic metal layer 24 and the drain ohmic metal layer 25 have different distances from the same P-type gallium nitride layer 23 which locates between the source ohmic metal layer and the drain ohmic metal layer. As shown in FIG. 5, a distance $L_1$ between the drain ohmic metal layer 25 and one P-type gallium nitride layer 23 is different from a distance $L_2$ between the source ohmic metal layer 24 and this P-type gallium nitride layer 23. The source ohmic metal layer 24 and the drain ohmic metal layer 25 are connected to the active region gallium nitride layer 21. A gate metal layer 231 is disposed on each P-type gallium nitride layer 23. A gate pad 27 is disposed on one side of the active region gallium nitride layer 21, and the gate pad 27 is connected to the gate metal layer 231 through a metal lead wire 271. A gate interconnection metal layer 272 and a gate top metal layer 273 are sequentially disposed on the gate pad 27. A source interconnection metal layer 241 and source top metal layers 242 are sequentially disposed on the source ohmic metal layer 24. A drain interconnection metal layer 251 and drain top metal layers 252 are sequentially disposed on the drain ohmic metal layer 25. An isolating dielectric layer 26 is deposited in gaps among the source top metal layers 242, the drain top metal layers 252, the gate top metal layer 273, and the gallium nitride layer b. The wide bandgap semiconductor part 2 is disposed above the substrate 1 and is connected to the metal plates 11 through the source top metal layers 242, the drain top metal layers 252, and the gate top metal layer 273. A region, that is provided with the active region gallium nitride layer 21, of the gallium nitride layer b is an active region. A region, that is provided with the source ohmic metal layer 24, the source interconnection metal layer 241, and the source top metal layers 242, of the active region is a source region. A region, that is provided with the drain ohmic metal layer 25, the drain interconnection metal layer 251, and the drain top metal layers 252, of the active region is a drain region. And a region, that is provided with the P-type gallium nitride layers 23 and the gate metal layer 231, of the active region is a gate region.

In the embodiments of the present invention, as shown in FIG. 3, the wide bandgap semiconductor structure for the irradiation characteristic test is prepared through the following steps: first, sequentially growing a substrate layer a, a gallium nitride layer b, and a barrier layer 22 to form a structure that sequentially includes a silicon substrate layer a with a thickness of 0.65 mm, a gallium nitride layer b with a thickness of 4500 nm, and a barrier layer 22 with a thickness of 13 nm from bottom to top; then, growing a P-type gallium nitride layer 23 with a thickness of 100 nm on the barrier layer 22; and afterwards, etching and removing the P-type gallium nitride layer 23 in a non-graphic region by using an inductively coupled plasma dry etching method, and etching the barrier layer 22 located outside the active region and a partial thickness of the gallium nitride layer b located outside the active region to obtain the active region gallium nitride layer 21. When etching the gallium nitride layer b outside the active region, a certain thickness of the gallium nitride layer is removed and a partial thickness of the gallium nitride layer is retained.

Referring to FIG. 3 and FIG. 4, an isolating dielectric layer 26 made of silicon nitride is grown above the entire gallium nitride layer b using a plasma enhanced chemical vapor deposition method. The isolating dielectric layers 26 and the barrier layer 22 in the source region and the drain region are etched using an inductively coupled plasma dry etching method and a photolithographic stripping method, and a source ohmic metal layer 24 and a drain ohmic metal layer 25 made of Ti/Al are sequentially deposited at etching positions.

Referring to FIG. 6, an isolating dielectric layer 26 made of silicon nitride is grown above the entire gallium nitride layer b again. Part of the isolating dielectric layers 26 above the P-type gallium nitride layers 23 in the gate region and on a near side of the active region gallium nitride layer 21 are removed by etching. A gate metal layer 231 is deposited on the P-type gallium nitride layers 23. A gate pad 27 is deposited on one side of the active region gallium nitride layer 21, and a metal lead wire 271 is also deposited. And one end of the metal lead wire 271 is connected to the gate metal layer 231, and the other end thereof is connected to the gate pad 27.

Referring to FIG. 7, an isolating dielectric layer 26 is entirely deposited upwards again. The isolating dielectric layers 26 above the source ohmic metal layer 24, the drain ohmic metal layer 25, and the gate pad 27 are etched. And a source interconnection metal layer 241, a drain interconnection metal layer 251, and a gate interconnection metal layer 272 are deposited at corresponding positions, respectively.

Referring to FIG. 8, an isolating dielectric layer 26 is entirely deposited upwards again. The isolating dielectric layers 26 above the source interconnection metal layer 241, the drain interconnection metal layer 251, and the gate interconnection metal layer 272 are etched. And source top metal layers 242, drain top metal layers 252, and a gate top metal layer 273 are deposited, respectively.

Finally, referring to FIG. 9, by connecting the source top metal layers 242, the drain top metal layers 252, and the gate top metal layer 273 to the metal plates 11 that are disposed on the substrate 1 in one-to-one correspondence, the structure prepared through the above steps is flipped on the substrate 1. Exemplarily, the source top metal layers 242, the drain top metal layers 252, and the gate top metal layer 273 are soldered to the metal plates 11 by a metal filling solder, thereby ensuring the connection stability and good electrical contact. Afterwards, the substrate layer a is stripped off using a laser stripping technique to form the wide bandgap semiconductor structure shown in FIG. 1 and FIG. 2, so that the gallium nitride layer b is located on the uppermost layer of the entire wide bandgap semiconductor structure, and the package fabrication of the GaN HEMT structure is completed. Exemplarily, high-energy pulsed laser with an ultra-violet wavelength is used in the laser stripping technique.

Compared to the conventional GaN HEMT, according to the wide bandgap semiconductor structure for an irradiation characteristic test provided by the embodiments of the present invention, the wide bandgap semiconductor part 2 is flipped on the substrate 1 by metal bonding, and a substrate layer at the bottom of the conventional transistor is stripped off using a laser stripping method during preparation, so that the gallium nitride layer b is located at the top of the entire wide bandgap semiconductor structure. At this time, irradiation is performed by means of incidence from the top, so that the irradiation rays or particles can easily reach the active region of the device, thereby ensuring the effect of irradiation tests and solving the problem in the prior art that the wide bandgap semiconductor structure has poor effect of irradiation characteristic tests.

Optionally, the P-type gallium nitride layers 23 are strip-shaped, a length direction of each P-type gallium nitride layer 23 is taken as an X direction, a width direction of each P-type gallium nitride layer 23 is taken as a Y direction, and a thickness direction of each P-type gallium nitride layer 23 is taken as a Z direction. The X, Y and Z directions follow the directions shown in FIG. 4, similarly hereinafter.

The source top metal layers 242 and the drain top metal layers 252 are alternately arranged along the X direction, and the thicknesses of the source top metal layers 242 and the drain top metal layers 252 are different in the Z direction. Exemplarily, in an embodiment of the present invention, the P-type gallium nitride layers 23 are arranged in a strip shape. In the X direction, the source top metal layers 242 and the drain top metal layers 252 are alternately arranged, and the thicknesses of the top metal layers are designed to gradually increase during deposition, so that after the wide bandgap semiconductor part 2 is flipped on the substrate 1, the gallium nitride layer b located at the top is obliquely arranged at a certain included angle α to the substrate 1, where a range of a is greater than 0° and less than 90°. According to the wide bandgap semiconductor structure for the irradiation characteristic test that is finally prepared through the design, without adjusting an incident angle of an irradiation light source, the included angle α can be finely adjusted by adjusting the angle of the substrate 1 or by adjusting the deposition thicknesses of the source top metal layers 242 and the drain top metal layers 252 during preparation, and thus the irradiation tests can be performed conveniently and quickly at different angles, and the test efficiency can be effectively improved.

Exemplarily, in an embodiment of the present invention, a width of each P-type gallium nitride layer 23 ranges from 1 μm to 4 μm. A width of the gate metal layer 231 is equal to that of each P-type gallium nitride layer 23. A distance between each P-type gallium nitride layer 23 and the adjacent source ohmic metal layer 24 ranges from 1 μm to 3 μm. A distance between each P-type gallium nitride layer 23 and the adjacent drain ohmic metal layer 25 ranges from 3 μm to 25 μm. The source ohmic metal layer 24 and the drain ohmic metal layer 25 are in the form of a vertical plate parallel to the P-type gallium nitride layers 23, and have a width ranging from 1 μm to 3 μm in the Y direction. The P-type gallium nitride layers 23 have a thickness ranging from 50 nm to 200 nm in the Z direction. The gate metal layer 231 has a thickness ranging from 0.5 μm to 1 μm. The source ohmic metal layer 24 and the drain ohmic metal layer 25 are both in contact with a top surface of the active region gallium nitride layer 21, and have a thickness ranging from 0.5 μm to 2 μm.

Optionally, a plurality of source top metal layers 242 are disposed above the source interconnection metal layer 241, and a plurality of drain top metal layers 252 are disposed above the drain interconnection metal layer 251. In the X direction, the plurality of source top metal layers 242 and the plurality of drain top metal layers 252 are sequentially and alternately disposed at intervals and have gradually increasing thicknesses. Exemplarily, in an embodiment of the present invention, in the X direction, the plurality of source top metal layers 242 and the plurality of drain top metal layers 252 are alternately arranged at intervals, and the deposition thicknesses are sequentially decreased based on the arrangement requirements of the included angle between the active region gallium nitride layer 21 and the substrate 1, thereby ensuring the connection stability of the structure when being flipped on the substrate 1. At the same time, the plurality of source top metal layers 242 and the plurality of drain top metal layers 252 are used to perform multi-point connection, which facilitates the flow of current in a response process during irradiation tests, reduces the current delay, and ensures the corresponding effect and the test reliability.

Exemplarily, when it is required to dispose a plurality of source top metal layers 242 and drain top metal layers 252 that are sequentially and alternately arranged at intervals above the source interconnection metal layer 241 and the drain interconnection metal layer 251, an isolating dielectric layer 26 is first deposited in one piece, the isolating dielectric layers 26 on the source interconnection metal layer 241, the drain interconnection metal layer 251, and the gate interconnection metal layer 272 are etched. And a source top metal layer 242, a drain top metal layer 252, and a gate top metal layer 273 with a thickness of $h_0=1$ μm are deposited, respectively.

Afterwards, a top metal layer with a thickness of $h_1-h_0=200$ μm is deposited again above the source top metal layers 242 and the drain top metal layers 252 using a photolithographic stripping method. Then, a top metal layer with a thickness of $h_2-h_1=200$ μm is deposited again on other source top metal layers 242 and drain top metal layers 252 except for the top metal layers with thicknesses of $h_1$ and $h_0$ using the photolithographic stripping method. Such operation is repeated until a top metal layer with a thickness of $h_4=804$ μm is formed. As shown in FIG. 7, a plurality of source top metal layers 242 and a plurality of drain top metal layers 252 that are sequentially and alternately arranged at intervals and have different thicknesses are formed.

Among them, the photolithographic stripping method refers to the following steps: coating a photoresist on a whole piece, exposing positions where metal needs to be deposited, removing the photoresist at exposed positions and depositing a metal layer in one piece after exposure, and then removing the remaining photoresist, allowing the metal layer on the photoresist to fall off accordingly. Therefore, the metal layers can be deposited only at specific positions, and the overall preparation efficiency can be effectively improved.

It should be noted that by implementing multi-point connections between the plurality of source top metal layers 242 and drain top metal layers 252 and the plurality of metal plates 11 on the substrate 1, the contact area between the wide bandgap semiconductor part 2 and the substrate 1 is increased, so that a large amount of heat generated by carrier aggregation during irradiation can be effectively dissipated, thereby facilitating the reinforcement design of the device subjected to irradiation.

Exemplarily, in the X direction, the gate pad 27 is located on one side of the wide bandgap semiconductor part 2 and is connected to the gate metal layer 231 through the metal lead wire 271. The gate pad 27 is provided with a gate interconnection metal layer 272 and a gate top metal layer 273. In an embodiment of the present invention, the gate interconnection metal layer 272 and the gate top metal layer 273 entirely serve as a control electrode of the wide bandgap semiconductor structure, and after preparation is completed, the electrical conductivity of the wide bandgap semiconductor structure is adjusted by controlling the voltage of the gate interconnection metal layer and the gate top metal layer. During deposition of the gate metal layer 231, the active region gallium nitride layer 21 may be led out via the metal lead wire 271 and the gate metal layer 231 along the X direction, and the preparation of the gate interconnection metal layer 272 and the gate top metal layer 273 may be performed on one side of the wide bandgap semiconductor part 2 using the same process. Further, the gate pad 27 is located on one side of the source top metal layer 242 or the drain top metal layer 252 with a minimum thickness, and the gate top metal layer 273 has a thickness less than that of the source top metal layer 242 or the drain top metal layer 252 with the minimum thickness. When the preparation is completed and the wide bandgap semiconductor part 2 is flipped, the wide bandgap semiconductor part can be connected to the metal plates 11 that are correspondingly disposed on the substrate 1 in an arrangement order, so as to ensure the formation of a certain included angle α between the active region gallium nitride layer 21 and the substrate 1 while achieving the gate function of a normal semiconductor structure.

Exemplarily, in an embodiment of the present invention, the sum of the numbers of the plurality of source top metal layers 242 and the plurality of drain top metal layers 252 ranges from 2 to 20. The thicknesses of the gate top metal layer 273, the source top metal layers 242, and the drain top metal layers 252 that are sequentially and alternately arranged are, from minimum to maximum, $h_0, h_1, h_2 \ldots h_n$ (n being a positive integer), respectively in the Z direction, the corresponding widths (i.e., the widths in the X direction) are $w_0, w_1, w_2 \ldots w_n$, respectively, and the spacings (i.e., the spacings in the X direction) between adjacent top metal layers are $d_1, d_2 \ldots d_n$, where the respective widths and spacings are not required to be equal. The thickness $h_0$ of the gate top metal layer 273 ranges from 0.5 µm to 5 µm. The width of each top metal layer ranges from 100 µm to 1000 µm, and the spacings between the adjacent top metal layers range from 100 µm to 1000 µm. The relation between the thickness of the source top metal layer 242 or the drain top metal layer 252 and that of the gate top metal layer 273 is represented as the following formula:

$$h_n = \left( \sum_{p=0}^{n-1} w_p + \sum_{q=1}^{n} d_q \right) \cdot \tan \alpha + h_0$$

where $h_n$ is the thickness of the source top metal layer 242 or the drain top metal layer 252; $w_p$ is the width of the gate top metal layer 273, the width of the source top metal layer 242, or the width of the drain top metal layer 252; $d_q$ is the spacing between the gate top metal layer 273 and the source top metal layer 242 or the drain top metal layer 252, or, is the spacing between the source top metal layer 242 and the drain top metal layer 252; α is the included angle between the gallium nitride layer b and the substrate 1; and $h_0$ is the thickness of the gate top metal layer 273.

Optionally, the isolating dielectric layer 26 is deposited among the source top metal layers 242 and the source interconnection metal layer 241, and first etching vias 261 are formed in the isolating dielectric layer 26. As shown in FIG. 8, a plurality of source top metal layers 242 are located on one source interconnection metal layer 241, and the plurality of source top metal layers 242 are connected to the source interconnection metal layer 241 through metal deposited in the first etching vias 261. The isolating dielectric layer 26 is deposited among the drain top metal layers 252 and the drain interconnection metal layer 251, and second etching vias 262 are formed in the isolating dielectric layer 26. As shown in FIG. 9, a plurality of drain top metal layers 252 are located on one drain interconnection metal layer 251, and the plurality of drain top metal layers 252 are connected to the drain interconnection metal layer 251 through metal deposited in the second etching vias 262.

Exemplarily, in an embodiment of the present invention, the source interconnection metal layer 241 is in direct contact with the source ohmic metal layer 24, and the drain interconnection metal layer 251 is in direct contact with the drain ohmic metal layer 25. Both the source interconnection metal layer 241 and the drain interconnection metal layer 251 will be extended towards the top of the gate metal layer 231 to form field plates, and both cross sections thereof form a shape composed of a plurality of "T" shapes that are stacked together, and if at the edges, the shape would be a comb shape extending to one side. In the Y direction, the number of the "T"-shaped structures is the number of the field plates, for example, 2 in the embodiment of the present invention. Among them, a field plate width of the source interconnection metal layer 241, i.e., a distance in the Y direction by which the source interconnection metal layer 241 extends beyond the source ohmic metal layer 24 located below towards the gate metal layer 231, is 3 µm to 20 µm. A field plate width of the drain interconnection metal layer 251 ranges from 1 µm to 5 µm. The spacing between the source interconnection metal layer 241 and the drain interconnection metal layer 251 ranges from 1 µm to 5 µm. The spacing between two adjacent field plates ranges from 0.2 µm to 1 µm. A thickness of a single field plate ranges from 0.2 µm to 2 µm. The thicknesses of the source interconnection metal layer 241 and the drain interconnection metal layer 251 range from 0.5 µm to 6 µm, and the lengths thereof are equal to that of the source ohmic metal layer 24 and the drain ohmic metal layer 25 located below, respectively.

When a plurality of P-type gallium nitride layers 23 are disposed in parallel on the barrier layer 22 at intervals, and a plurality of source ohmic metal layers 24 or drain ohmic metal layers 25 parallel to the P-type gallium nitride layers 23 as well as a plurality of interconnection metal layers and top metal layer structures located thereabove respectively are disposed, since the source top metal layer 242 is required to span the field plates of a plurality of source interconnection metal layers 241, and the drain top metal layer 252 is required to span the field plates of a plurality of drain interconnection metal layers 251. Therefore, by forming first etching vias 261 in the isolating dielectric layer 26 deposited on the source interconnection metal layer 241 for the connection between the source top metal layer 242 and the source interconnection metal layer 241, and by forming second etching vias 262 in the isolating dielectric layer 26 deposited on the drain interconnection metal layer 251 for the connection between the drain top metal layer 252 and the drain interconnection metal layer 251, it is ensured that no mutual contact exists at other positions, and the electrical isolation between a source and a drain can be achieved.

Optionally, a plurality of P-type gallium nitride layers 23 are disposed in parallel on the barrier layer 22 at intervals. The same source ohmic metal layer 24 or the same drain ohmic metal layer 25 is commonly used between two adjacent P-type gallium nitride layers 23. A length of each source top metal layer 242 in the Y direction is greater than or equal to a maximum spacing between inner surfaces of two first etching vias 261 that are located in the same Y direction and are furthest apart from each other, and a length of each drain top metal layer 252 in the Y direction is greater than or equal to a maximum spacing between inner surfaces of two second etching vias 262 that are located in the same Y direction and are furthest apart from each other. Exemplarily, in an embodiment of the present invention, further, when a plurality of P-type gallium nitride layers 23 are disposed in parallel on the barrier layer 22 at intervals, and a plurality of source ohmic metal layers 24 or drain ohmic metal layers 25 parallel to the P-type gallium nitride layers 23 as well as a plurality of interconnection metal layers and top metal layers located thereabove respectively are disposed, during preparation of the source top metal layer 242 and the drain top metal layer 252, the lengths of the source top metal layer 242 and the drain top metal layer 252 in the Y direction are set to be greater than the maximum spacing between two etching vias that are located below the source top metal layer and the drain top metal layer in the same Y direction and are furthest apart from each other, so as to leave a portion of deposition margin when etching the isolating dielectric layers 26, thereby facilitating the deposition and preparation of the top metal layers, effectively improving the overall preparation efficiency, and further ensuring that the top metal layers can be stably connected to the corresponding metal plate 11.

Optionally, each isolating dielectric layer 26 is made of silicon dioxide, silicon nitride, or polyimide. Exemplarily, in an embodiment of the present invention, each isolating dielectric layer 26 is made of any one or a combination of two or more of silicon dioxide, silicon nitride, or polyimide. When a plurality of depositions are performed during the preparation of the wide bandgap semiconductor part 2, the materials of the isolating dielectric layers 26 deposited each time may be different, but all of them have the electrical isolation effect, therefore, after the preparation is completed, the isolating dielectric layers 26 deposited multiple times can be regarded as an integrated isolating dielectric layer 26.

Exemplarily, in an embodiment of the present invention, the substrate 1 is made of non-conductive non-metallic material and has a thickness of 0.5 cm. A plurality of metal plates 11 are arranged on the substrate 1 at intervals. Each metal plate 11 has a thickness of 3 µm and is strip-shaped. A length of each metal plate 11 in the Y direction is equal to that of the source top metal layer 242 and that of the drain top metal layer 252 in the Y direction, and two adjacent metal plates 11 are not in contact with each other and have a spacing of 100 µm.

Optionally, a plurality of metal plates 11 are disposed on the substrate 1 at intervals and are in one-to-one correspondence with the gate top metal layer 273, the source top metal layers 242, and the drain top metal layers 252. The metal plates 11 are rectangular and have a length ranging from 1 cm to 3 cm, a width ranging from 1 cm to 3 cm, and a thickness ranging from 0.1 cm to 0.7 cm. Exemplarily, in an embodiment of the present invention, a plurality of metal plates 11 that are distributed at intervals are disposed on the substrate 1 and have thicknesses of 0.5 µm to 10 µm. The length of each metal plate 11 in the Y direction is greater than or equal to the length of the longest top metal layer, the width of each metal plate is greater than or equal to the width of the widest top metal layer, and the spacing of the metal plates is less than or equal to the spacing of two adjacent top metal layers. The two adjacent metal plates 11 are not in contact with each other and have a spacing of greater than 100 µm.

Figure 10:
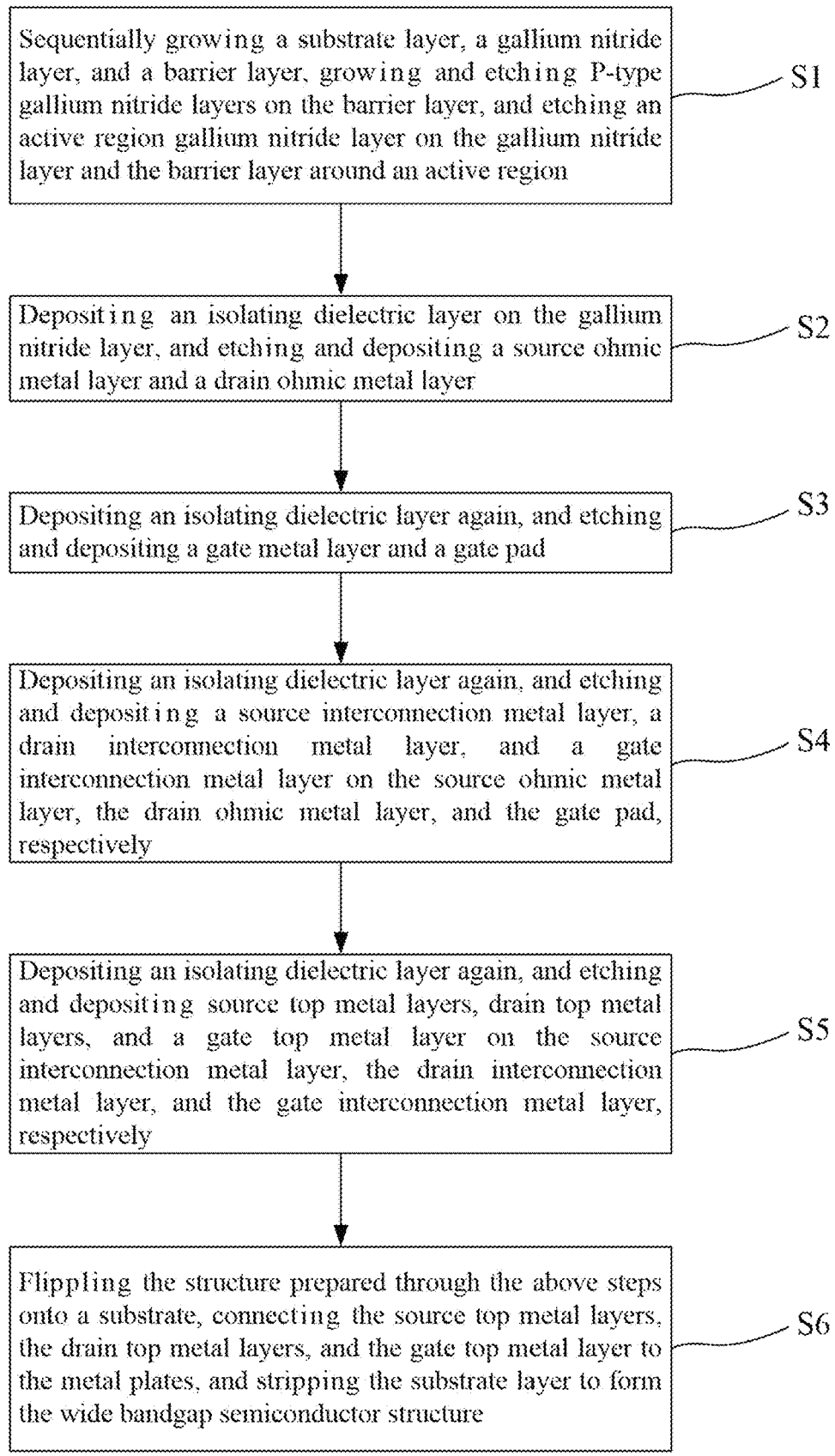
FIG. 10 is a flowchart of a method for preparing a wide bandgap semiconductor structure for an irradiation characteristic test provided by an embodiment of the present invention.

As shown in FIG. 10, the embodiments of the present invention further provide a preparation method for preparing the wide bandgap semiconductor structure for an irradiation characteristic test as shown in FIG. 1 to FIG. 9. The preparation method includes the following steps:

S1, sequentially growing the substrate layer a, the gallium nitride layer b, and the barrier layer 22, growing and etching the P-type gallium nitride layers 23 on the barrier layer 22, etching the gallium nitride layer b and the barrier layer, and removing the barrier layer 22 around an active region and a partial thickness of the gallium nitride layer around the active region to obtain the active region gallium nitride layer 21;

S2, depositing an isolating dielectric layer 26 on the gallium nitride layer b, and etching and depositing the source ohmic metal layer 24 and the drain ohmic metal layer 25;

S3, depositing an isolating dielectric layer 26 again, and etching and depositing the gate metal layer 231, the gate pad 27, and the metal lead wire 271;

S4, depositing an isolating dielectric layer 26 again, and etching and depositing the source interconnection metal layer 241, the drain interconnection metal layer 251, and the gate interconnection metal layer 272 on the source ohmic metal layer 24, the drain ohmic metal layer 25, and the gate pad 27, respectively; and S5, depositing the isolating dielectric layer 26 again, and etching and depositing the source top metal layers 242, the drain top metal layers 252, and the gate top metal layer 273 on the source interconnection metal layer 241, the drain interconnection metal layer 251, and the gate interconnection metal layer 272, respectively; where S5 may further include:

S5 including the following steps:

S51, depositing an isolating dielectric layer 26 in one piece, etching the isolating dielectric layers 26 above the source interconnection metal layer 241, the drain interconnection metal layer 251, and the gate interconnection metal layer 272, and depositing a source top metal layer 242, a drain top metal layer 252, and a gate top metal layer 273 with a thickness of $h_0$, respectively; and S52, depositing again a source top metal layer 242 and a drain top metal layer 252 with a thickness of $h_1$-$h_0$ above the source top metal layers 242 and the drain top metal layers 252, and repeating such operation until the source top metal layer 242 or the drain top metal layer 252 with a thickness of $h_n$ (n being greater than or equal to 2) is formed, so as to form a plurality of source top metal layers 242 and a plurality of drain top metal layers 252 that are sequentially and alternately arranged and have different thicknesses; and S6, flipping the structure prepared through the above steps onto a substrate 1, connecting the source top metal layers 242, the drain top metal layers 252, and the gate top metal layer 273 to the metal plates 11, and stripping the substrate layer a to form the wide bandgap semiconductor structure.

Compared to the conventional GaN HEMT, according to the wide bandgap semiconductor structure for an irradiation characteristic test prepared by adopting the above preparation method, the wide bandgap semiconductor part is flipped on the substrate by metal bonding, and a substrate layer at the bottom of the conventional transistor structure is stripped off using a laser stripping method during preparation, so that the gallium nitride layer is located at the top layer of the entire wide bandgap semiconductor structure. At this time, irradiation is performed by means of incidence from the bottom, so that the irradiation rays or particles can easily reach the active region of the device, thereby ensuring the effect of irradiation tests and solving the problem in the prior art that the wide bandgap semiconductor structure has poor effect of irradiation characteristic tests.

Further, the thickness of the top layer of each top metal layer is differentiated during deposition of the wide bandgap semiconductor part, so that the gallium nitride layer located at the top is arranged at a certain included angle to the substrate after the wide bandgap semiconductor part is flipped on the substrate. Without adjusting an incident angle of an irradiation light source, the included angle can be finely adjusted by adjusting the angle of the substrate or by adjusting the deposition thicknesses of the source top metal layers and the drain top metal layers during preparation, and thus the irradiation tests can be performed conveniently and quickly at different angles, and the test efficiency can be effectively improved.

Still further, by implementing multi-point connections between the gate top metal layer 273, the plurality of source top metal layers 242, and the plurality of drain top metal layers 252 and the metal plates 11 on the substrate 1, the contact area between the wide bandgap semiconductor part 2 and the substrate 1 is increased, so that a large amount of heat generated by carrier aggregation during irradiation can be effectively dissipated, thereby facilitating the reinforcement design of the wide bandgap semiconductor structure subjected to irradiation.

Unless otherwise defined, the technical or scientific terms used herein shall have the common meanings as understood by those skilled in the art to which the present invention belongs. The terms "first", "second", and the like used in the description and claims of the present invention patent application are not intended to indicate any sequence, amount or importance, but distinguish different components. Also, the terms such as "a", "an", and the like are not intended to limit the amount, but indicate the existence of at least one. The terms such as "include", "comprise", and the like mean that an element or item appearing before "include" or "comprise" covers an element, an item, or an equivalent thereof listed after "include" or "comprise" without excluding other elements or items. The terms such as "connection", "connected", and the like are not limited to a physical or mechanical connection but may include a direct or indirect electrical connection. The terms such as "up", "down", "left", "right", and the like are merely used to represent a relative positional relationship, and when an absolute position of a described object changes, the relative positional relationship may also change accordingly.

The foregoing descriptions are merely optional embodiments of the present invention, but are not intended to limit the present invention. Any modification, equivalent replacement, or improvement made without departing from the spirit and principle of the present invention shall fall within the protection scope of the present invention.

What is claimed is:

1. A wide bandgap semiconductor structure for an irradiation characteristic test, comprising:
a substrate, where metal plates are disposed on the substrate at intervals; and
a wide bandgap semiconductor part, comprising a gallium nitride layer, a barrier layer, and P-type gallium nitride layers that are arranged in a stacked manner, wherein the P-type gallium nitride layers are located above an active region gallium nitride layer in a middle part of the gallium nitride layer, a gate metal layer is disposed on each P-type gallium nitride layer, two sides of the gate metal layer are provided with a source ohmic metal layer and a drain ohmic metal layer respectively, the source ohmic metal layer and the drain ohmic metal layer have different distances from the P-type gallium nitride layers, the source ohmic metal layer and the drain ohmic metal layer are connected to the active region gallium nitride layer, a gate pad is disposed on one side of the active region gallium nitride layer, the gate pad is connected to the gate metal layer through a metal lead wire, a gate interconnection metal layer and a gate top metal layer are disposed on the gate pad, a source interconnection metal layer and source top metal layers are disposed on the source ohmic metal layer, a drain interconnection metal layer and drain top metal layers are disposed on the drain ohmic metal layer, an isolating dielectric layer is deposited in gaps among the source top metal layers, the drain top metal layers, the gate top metal layer, and the gallium nitride layer, the wide bandgap semiconductor part is disposed above the substrate and is connected to the metal plates through the source top metal layers and the drain top metal layers, enabling the gallium nitride layer to be exposed above an entire structure.

2. The wide bandgap semiconductor structure for an irradiation characteristic test according to claim 1, wherein the P-type gallium nitride layers are strip-shaped, the source top metal layers and the drain top metal layers are disposed at intervals along a length direction of each P-type gallium nitride layer, and the source top metal layers have different thicknesses from that of the drain top metal layers.

3. The wide bandgap semiconductor structure for an irradiation characteristic test according to claim 2, wherein a plurality of source top metal layers are disposed on the source interconnection metal layer, a plurality of drain top metal layers are disposed on the drain interconnection metal layer, and the plurality of source top metal layers and the plurality of drain top metal layers are sequentially and alternately disposed at intervals along the length direction of each P-type gallium nitride layer and have gradually increasing thicknesses.

4. The wide bandgap semiconductor structure for an irradiation characteristic test according to claim 2, wherein the gate pad is located on one side of one of the source top metal layers or one of the drain top metal layers with a minimum thickness, and the gate top metal layer has a thickness less than that of one of the source top metal layers or the one of the drain top metal layers with the minimum thickness.

5. The wide bandgap semiconductor structure for an irradiation characteristic test according to claim 3, wherein a first etching via is provided in the isolating dielectric layer deposited between each source top metal layer of the source top metal layers and the source interconnection metal layer, each source top metal layer of the source top metal layers is connected to the source interconnection metal layer through metal deposited in the first etching via; and a second etching via is provided in the isolating dielectric layer deposited between each drain top metal layer of the drain top metal layers and the drain interconnection metal layer, each drain top metal layer of the drain top metal layers is connected to the drain interconnection metal layer through metal deposited in the second etching via.

6. The wide bandgap semiconductor structure for an irradiation characteristic test according to claim 1, wherein the source top metal layers, the drain top metal layers, and the gate top metal layer are soldered and fixed to the metal plates through a filling solder.

7. The wide bandgap semiconductor structure for an irradiation characteristic test according to claim 1, wherein a plurality of metal plates are disposed on the substrate at intervals and are in one-to-one correspondence with the gate top metal layer, the source top metal layers, and the drain top metal layers, and the metal plates are rectangular and have a length ranging from 1 cm to 3 cm, a width ranging from 1 cm to 3 cm, and a thickness ranging from 0.1 cm to 0.7 cm.

* * * * *